(12) United States Patent
Bray et al.

(10) Patent No.: US 7,858,936 B2
(45) Date of Patent: Dec. 28, 2010

(54) SLICE AND VIEW WITH DECORATION

(75) Inventors: Matthew Bray, Portland, OR (US);
Marc Castagna, Portland, OR (US)

(73) Assignee: FEI Company, Hillsboro, OR (US)

( * ) Notice: Subject to any disclaimer, the term of this patent is extended or adjusted under 35 U.S.C. 154(b) by 271 days.

(21) Appl. No.: 12/328,581

(22) Filed: Dec. 4, 2008

(65) Prior Publication Data
US 2009/0242759 A1  Oct. 1, 2009

Related U.S. Application Data

(60) Provisional application No. 60/992,998, filed on Dec. 6, 2007.

(51) Int. Cl.
*G01N 23/00* (2006.01)
(52) U.S. Cl. .................. 250/307; 250/306; 250/310; 250/311; 250/492.1; 250/492.2; 250/492.3
(58) Field of Classification Search .............. 250/306, 250/307, 310, 311, 492.1, 492.2, 492.3
See application file for complete search history.

(56) References Cited

U.S. PATENT DOCUMENTS

| | | | |
|---|---|---|---|
| 5,435,850 A | 7/1995 | Rasmussen | |
| 5,698,397 A | 12/1997 | Zarling et al. | |
| 5,851,413 A | 12/1998 | Casella et al. | |
| 5,990,478 A * | 11/1999 | Liu | ............ 250/307 |
| 6,546,788 B2 | 4/2003 | Magerle | |
| 6,888,136 B2 | 5/2005 | Geurts et al. | |
| 7,103,505 B2 | 9/2006 | Teshima et al. | |
| 7,312,448 B2 | 12/2007 | Principe | |
| 7,317,515 B2 | 1/2008 | Buijsse et al. | |
| 7,348,556 B2 | 3/2008 | Chitturi et al. | |
| 7,709,792 B2 * | 5/2010 | Naser-Ghodsi et al. | ..... 250/310 |
| 2007/0067131 A1 | 3/2007 | Teshima et al. | |
| 2008/0088831 A1 | 4/2008 | Mulders et al. | |
| 2009/0220130 A1 | 9/2009 | Slingerland | |

OTHER PUBLICATIONS

Holzer, L., et al., Three-Dimensional Analysis of Porous BaTiO3 Ceramics Using FIB Nanotomography, Journal of Microscopy, Oct. 2004, pp. 84-95, vol. 216, Pt. 1.

Steer, T.J., et al., "3-D Focused Ion Beam Mapping of Nanoindentation Zones in a Cu-Ti Multilayered Coating," Thin Solid Films, 2002, pp. 147-154, vol. 413.

Frank, Joachim, "Electron Tomography, Three-Dimensional Imaging with the Transmission Electron Microscope," 1992, pp. 1-13.

Gonzalez-Melendi, Pablo, et al., "3-D Gold in Situ Labelling in the EM," The Planet Journal, 2002, pp. 237-243, vol. 29, Iss. 2.

(Continued)

*Primary Examiner*—Robert Kim
*Assistant Examiner*—Michael Maskell
(74) *Attorney, Agent, or Firm*—Scheinberg & Griner, LLP; Michael O. Scheinberg; David Griner

(57) ABSTRACT

Imprecisely located defects are imaged by milling a series of slices and performing a light, preferential etch to provide a topographical interface between materials having similar secondary electron emission characteristics. The slices are sufficiently small to capture small defects, but are sufficiently large to overcome problems with redeposition.

20 Claims, 11 Drawing Sheets

OTHER PUBLICATIONS

Harrison, Christopher, et al., "Layer by Layer Imaging of Diblock Copolymer Films with a Scanning Electron Microscope," Polymer, Jun. 1998, pp. 2733-2744, vol. 30, Iss. 13.

Heymann, Jurgen A.W., et al., "Site-Specific 3D Imaging of Cells and Tissues with a Dual Beam Microscope," Journal of Structural Biology, 2006, pp. 63-73, vol. 155, Iss. 1.

Shimizu, Daisaburo, et al., "Three-Dimensional Reconstruction by Scanning Electron Microscopy from Serial Epoxy Resin Semi-Thin Sections After Ion-Etching," Journal of Electron Microscopy, 2001, pp. 51-55, vol. 50.

Thiberge, Stephan, et al., "Scanning Electron Microscopy of Cells and Tissues under Fully Hydrated Conditions," Proceedings of the National Academy of Sciences, Mar. 9, 2004, vol. 101, Iss. 10, pp. 3346-3351.

Weninger, Wolfgang Johann, et al., "Phenotyping Transgenic Embryos: a Rapid 3-D Screening Method Based on Episcopic Fluorescence Image Capturing," Nature Genetics, Jan. 2002 (Published Online Dec. 17, 2001), 7 pgs.

Ewald, Andrew J., et al., 'Surface Imaging Microscopy, An Automated Method for Visualizing Whole Embryo Samples in Three Dimensions at High Resolution,' Developmental Dynamics, 2002, pp. 369-375, vol. 225.

Nagato, Yasukazu, et al., 'Observation on Backscattered Electron Image (BEI) of a Scanning Electron Microscope (SEM) in Semi-thin Secions Prepared for Light Microscopy,' Tokai J. Exp. Clin. Med., 1983, pp. 167-174, vol. 8, No. 2.

Scott, John E., et al., 'Dermatan sulphate-rich proteoglycan associates with rat tail-tendon collagen at the d band in the gap region,' Biochem. J., 1981, pp. 213-216, vol. 197.

* cited by examiner

SLICE AND VIEW WITH DECORATION

This application claims priority from U.S. Provisional Application 60/992,998, filed Dec. 6, 2007, which is hereby incorporated by reference.

TECHNICAL FIELD OF THE INVENTION

The present invention relates to charge particle beam imaging for nanotechnology.

BACKGROUND OF THE INVENTION

As technology is demanding the construction of ever smaller structures in electronic, optical, and micromechanical systems, defects on the order of nanometers or tens of nanometers can adversely affect the performance of devices. Such defects are routinely examined using electron microscopes to determine and correct the cause of the defects. Defects can include contaminant particles that become embedded in a product during fabrication or a manufacturing defect, such as a bridge creating a short circuit between two closely spaced conductors that are intended to be electrically separated from each other.

Dual beam instruments that include a focused ion beam column and an electron beam column, such as the CLM™ system manufactured by FEI Company, the assignee of the present invention, are used in the analysis of defects and process monitoring. Defects are typically located using a whole wafer scanning inspection system, such as those manufactured by KLA-Tencor. Those systems generate a defect file that includes the coordinates of all defects found. Defects are typically found by comparing one portion of a fabricated wafer with other portions of the wafer that are intended to be identical. Deviations from the normal appearance indicate the presence of a defect. A defect may be on the surface of the wafer or below the surface, covered by subsequently applied. While such inspection systems can locate defects, they are typically unable to provide detailed information about the defect, and so the wafer is typically then loaded into an imaging instrument, such as an electron microscope, to characterize the defect in more detail.

In dual beam instruments that are intended to monitor a fabrication process, such as a photolithography process, image recognition software finds features of interest and automatically measures the features of interest. The precise location of the features is known from the design data for the lithography mask or from the wafer layout data. The focused ion beam system can then mill a trench in the substrate to expose a cross section at the desired location for observation.

It is more difficult, however, to observe defects because their position is not known with the same precision. The defect positions determined by the scanning instruments are accurate only to within a few microns. Also, the coordinate systems used by the scanning device and the coordinate system of the imaging system are typically offset because of differences in the positioning of wafer in each system. The differences in the coordinate systems can be compensated by using an offset determined by measuring the same reference points in both systems. Even with a calculated offset, the defect position is still only accurate to a few microns. Because defects as small as tens of nanometers can adversely affect the functioning of products, it is necessary to locate and examine such small defects in detail.

One method of finding and examining a defect is using the Slice-and-View™ technique that is incorporated into the software of the Defect Analyzer™ 300 from FEI Company. In the Slice-and-View technique, the general area of the defect is first located from the coordinates in a defect file from an inspection instrument. A thin, preferably conductive, protective layer is deposited in the area around the defect location, for example, by using charged-particle-beam induced deposition from a precursor gas. For example, a tungsten layer may be deposited using an ion or electron beam to decompose a precursor gas, such as tungsten hexacarbonyl. After the defect area is located, a reference mark, referred to as a fiducial, such as an "X", is milled with the focused ion beam to provide a reference point and orientation near the defect site.

A sloping trench is then milled to expose a cross section in front of the expected defect location. An image of the cross section is then formed using the electron beam. Additional material is then milled from the cross section face to expose a new cross section face about typically about 0.03-0.04 microns from the first face, although the second cut can be made up to a micron or more from the cross-section face, depending on the size of the defect. A second electron beam image is then formed after the cut. The process of removing a small amount of material form the cross section face and forming an image is repeated, typically fifteen or twenty times. As the cross section wall progresses through the expected defect location, it is probable that one or more of the cuts will provide a useful image of the defect. The Slice-and-View technique is required, in part, because the position of the defect is not known with sufficient precision to directly position the beam to cut and observe a cross section of the defect. The Slice-and-View technique an also provide three dimensional information about some defects.

Even when an image of the defect is captured, it may be difficult to identify the defect or the separate processing layers around the defect, because there may be no or limited contrast between similar materials in a charged-particle-beam image. Electron or ion microscopy provides an image by detecting secondary electrons that are emitted when the primary beam of electrons or ions impacts the sample surface. The number of secondary electrons emitted and detected for each impacting primary beam particle depends on the composition and the topography of the sample. The electron beam image clearly shows topography and interfaces between certain materials, such as the interface between a metal layer and an oxide layer. The electron beam image does not, however, show very clearly interfaces between different materials that have similar secondary electron emission properties. For example, an electron beam image may not clearly show the boundary between different dielectric layers, such as an oxide layer and a nitride layer. To observe the interface between such layers, a process known as "decoration" is used. Decorating a cross section entails lightly etching the cross section using an etchant that etches the two materials at a different rate. The different etch rates leave a topographical feature at the interface of the two layers, and the topographical feature, such as a step, is then readily observable in the electron beam image.

Another method of improving contrast is to apply a material that preferentially binds to different materials and thereby changes the secondary electron emission characteristics of those materials. For example, the contrast between different polymers and between some biological materials can be improved using a stain of a heavy metal salt. U.S. patent application Ser. No. 11/893,022 for "Method of Obtaining Images from Slices of a Specimen," which is assigned to the assignee of the invention and which is hereby incorporated by reference, describes the use of a Slice-and-View technique that employs staining using, for example, osmium tetroxide (OsO$_4$). The stain preferentially binds to materials on the sample surface and does not remove any material from the substrate.

Unlike staining, the decoration process etches away material. It has not been possible to use decoration with a Slice-and-View technique because both processes remove material, and yet each slice must be sufficiently thin to ensure that a very small defect is captured in a cross section for viewing and not entire removed with a slice between observations.

Another complicating factor is that as the slices become thinner, the tungsten protective layer deposited on the surface has an increased tendency during milling to redeposit on the walls of the cross section, thereby creating artifacts and obscuring details of the cross section. Thin slices also have a tendency to "punch through" the cross section wall and mill below the wall.

SUMMARY OF THE INVENTION

An object of the invention is to provide a method and apparatus for viewing defects using a charged particle beam system.

This invention comprises a method and apparatus for milling multiple sequential cuts progressing into the face of a cross section wall. A decorating etch is performed on multiple ones of the cuts to accentuate material interfaces in an electron beam image. Embodiments of the invention allow capturing an image of a small defect while providing enhanced contrasts in the image.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more through understanding of the present invention, and advantages thereof, reference is now made to the following descriptions taken in conjunction with the accompanying drawings, in which.

DETAILED DESCRIPTION OF PREFERRED EMBODIMENTS

Figure 1:
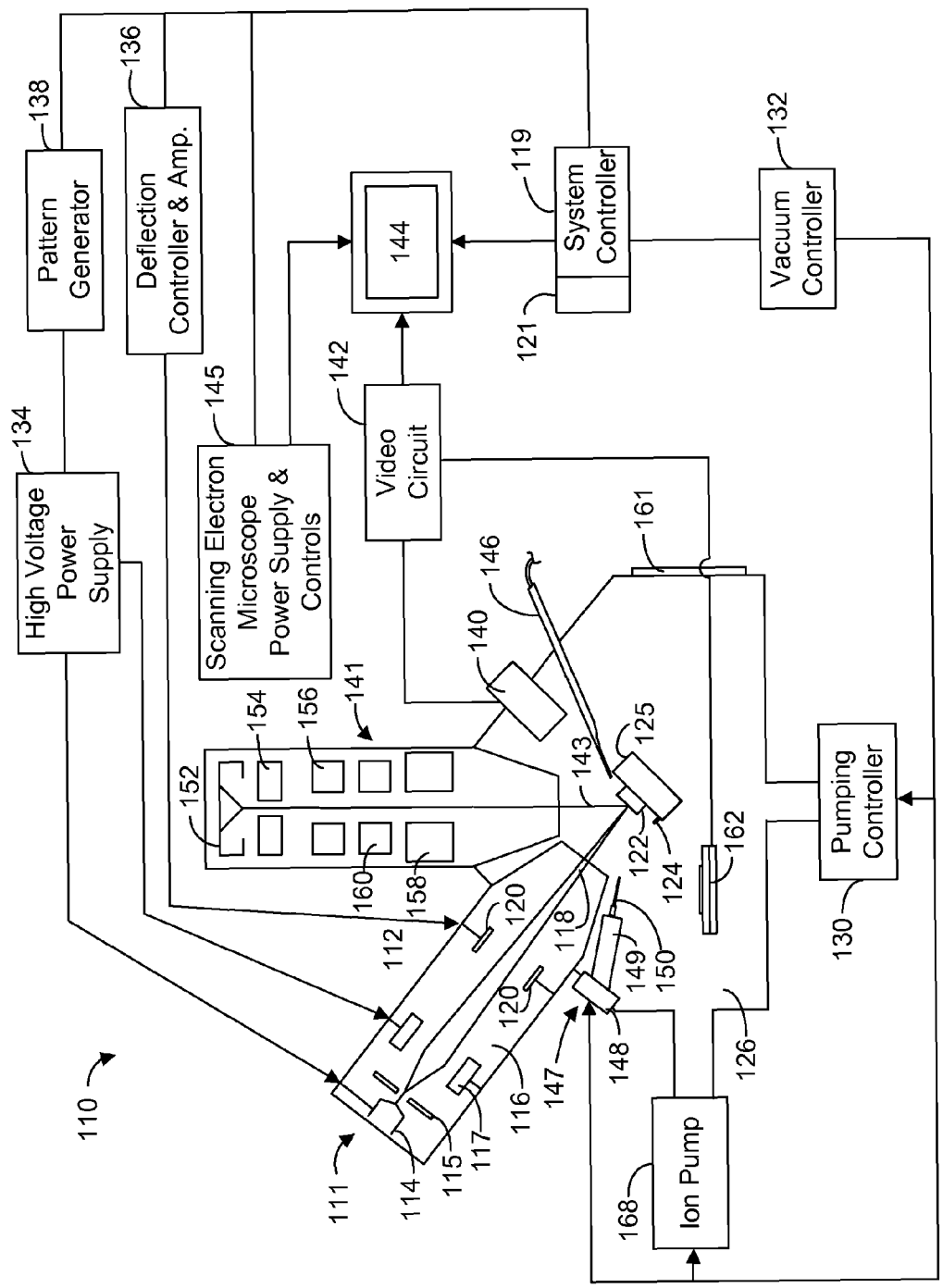
FIG. 1 shows a typical dual beam system used to implement the present invention.

Embodiments of the invention provide a tool that is useful in defect analysis in micromanufacturing and nanomanufacturing processes. In particular, embodiments are useful in a wafer fabrication facility for in-line failure analysis. The invention "steps through" the affected area of a substrate with a series of thin slices to provide a series of cross-sectional images that capture an enhanced-contrast image of the defect. The invention is useful, therefore, when the position of the defect is not known with sufficient precision to pre-align the beam with the defect and mill a cross section through its center. A decoration step between slices enhances the contrast between layers and between the defect and the surrounding material. The slices should be sufficiently thin to capture an image of a small defect and preferably to provide detailed three-dimensional information. As the slices get thinner however, the thinning effects of the decoration etch and the effects of redeposition must be considered in order to produce a useable image. Milling the slices must be performed with precision so that the each slice will have a useful thickness.

The system preferably uses a dual beam system including an electron beam column and an ion beam column. The ion beam column is typically oriented approximately normal, that is, less than about five degrees from normal, to the wafer surface; the electron beam is typically oriented at 52 degrees. The slices are typically milled using the ion beam and then the decorating and the imaging are performed using the electron beam. The positioning of the beams must be precise for each slice. If the ion beam is positioned too far into the cross section wall, a thin lamella will be left, obscuring the newly exposed wall. If the beam is positioned too far from the wall, insufficient or no material will be removed from the wall. The ion beam may also punch through the wall and mill the trench below. The stage upon which the wafer is mounted typically has some drift that causes the sample position to shift slightly over time. The charged-particle beam columns also have some drift, which causes the beams to change position relative to the stage and relative to each other. A laser-aligned stage can compensate for the stage drift. Many instruments, however, do not include a laser-aligned stage. Some instruments have image recognition software that can precisely locate the edge from the previous cut and align the beam relative to that edge. Many dual beam system, however, do not have edge recognition capability.

Another method used to provide precise beam placement is to mill a fiducial near the area to be cross-sectioned, and then to frequently re-image the fiducial and to mathematically adjust the positioning coordinates with offsets such that the fiducial coordinates are correct when the beam is positioned on the fiducial. Beam placement accuracy in the direction of the advancing cut is of primary importance because slices thickness and beam position advancements are measured in nanometers. The thin slices are typically produced by a "line mill," that is, milling essentially a one dimensional line rather than a "bulk mill," that is, milling a rectangle. Each slice is typically one or two pixels thick in an image, depending on the size of the field of view. A slice thickness of preferably between than about 30 nm and about 60 nm, more preferably between about 35 nm and about 45 nm, and most preferably between about 35 nm and about 40 nm. In one embodiment, applicants found that a slice thickness of about 38 nm is sufficient to capture an image of relative small defects while still providing an image having good contrast.

FIG. 1 shows a typical dual beam system 110 suitable for practicing the present invention, with a vertically mounted SEM column and a focused ion beam (FIB) column mounted at an angle of approximately 52 degrees from the vertical. Such dual beam systems are commercially available, for example, from FEI Company, Hillsboro, Oreg., the assignee of the present application. While an example of suitable hardware is provided below, the invention is not limited to being implemented in any particular type of hardware.

A scanning electron microscope 141, along with power supply and control unit 145, is provided with the dual beam system 110. An electron beam 143 is emitted from a cathode 152 by applying voltage between cathode 152 and an anode 154. Electron beam 143 is focused to a fine spot by means of a condensing lens 156 and an objective lens 158. Electron beam 143 is scanned two-dimensionally on the specimen by means of a deflection coil 160. Operation of condensing lens 156, objective lens 158, and deflection coil 160 is controlled by power supply and control unit 145.

Electron beam 143 can be focused onto substrate 122, which is on movable X-Y stage 125 within lower chamber 126. When the electrons in the electron beam strike substrate 122, secondary electrons are emitted. These secondary electrons are detected by secondary electron detector 140 as discussed below. STEM detector 162, located beneath the TEM sample holder 124 and the stage 125, can collect electrons that are transmitted through the sample mounted on the TEM sample holder as discussed above.

Dual beam system 110 also includes focused ion beam (FIB) system 111 which comprises an evacuated chamber having an upper neck portion 112 within which are located an ion source 114 and a focusing column 116 including extractor electrodes and an electrostatic optical system. The axis of focusing column 116 is tilted 52 degrees from the axis of the electron column. The ion column 112 includes an ion source 114, an extraction electrode 115, a focusing element 117, deflection elements 120, and a focused ion beam 118. Ion beam 118 passes from ion source 114 through column 116 and between electrostatic deflection means schematically indicated at 120 toward substrate 122, which comprises, for example, a semiconductor device positioned on movable X-Y stage 125 within lower chamber 126.

Stage 125 may also support one or more TEM sample holders 124 so that a sample can be extracted from the semiconductor device and moved to a TEM sample holder. Stage 125 can preferably move in a horizontal plane (X and Y axes) and vertically (Z axis). Stage 125 can also tilt approximately sixty (60) degrees and rotate about the Z axis. In some embodiments, a separate TEM sample stage (not shown) can be used. Such a TEM sample stage will also preferably be moveable in the X, Y, and Z axes. A door 161 is opened for inserting substrate 122 onto X-Y stage 125 and also for servicing an internal gas supply reservoir, if one is used. The door is interlocked so that it cannot be opened if the system is under vacuum.

An ion pump 128 is employed for evacuating neck portion 112. The chamber 126 is evacuated with turbomolecular and mechanical pumping system 130 under the control of vacuum controller 132. The vacuum system provides within chamber 126 a vacuum of between approximately $1 \times 10^{-7}$ Torr and $5 \times 10^{-4}$ Torr. If an etch assisting, an etch retarding gas, or a deposition precursor gas is used, the chamber background pressure may rise, typically to about $1 \times 10^{-5}$ Torr.

The high voltage power supply provides an appropriate acceleration voltage to electrodes in ion beam focusing column focusing 116 for energizing and focusing ion beam 118. When it strikes substrate 122, material is sputtered, that is physically ejected, from the sample. Alternatively, ion beam 118 can decompose a precursor gas to deposit a material.

High voltage power supply 134 is connected to liquid metal ion source 114 as well as to appropriate electrodes in ion beam focusing column 116 for forming an approximately 1 keV to 60 keV ion beam 118 and directing the same toward a sample. Deflection controller and amplifier 136, operated in accordance with a prescribed pattern provided by pattern generator 138, is coupled to deflection plates 120 whereby ion beam 118 may be controlled manually or automatically to trace out a corresponding pattern on the upper surface of substrate 122. In some systems the deflection plates are placed before the final lens, as is well known in the art. Beam blanking electrodes (not shown) within ion beam focusing column 116 cause ion beam 118 to impact onto blanking aperture (not shown) instead of substrate 122 when a blanking controller (not shown) applies a blanking voltage to the blanking electrode.

The liquid metal ion source 114 typically provides a metal ion beam of gallium. The source typically is capable of being focused into a sub one-tenth micrometer wide beam at substrate 122 for either modifying the substrate 122 by ion milling, enhanced etch, material deposition, or for the purpose of imaging the substrate 122.

A charged particle detector 140, such as an Everhart Thornley or multi-channel plate, used for detecting secondary ion or electron emission is connected to a video circuit 142 that supplies drive signals to video monitor 144 and receiving deflection signals from a system controller 119. The location of charged particle detector 140 within lower chamber 126 can vary in different embodiments. For example, a charged particle detector 140 can be coaxial with the ion beam and include a hole for allowing the ion beam to pass. In other embodiments, secondary particles can be collected through a final lens and then diverted off axis for collection.

A micromanipulator 247, such as the AutoProbe 200™ from Omniprobe, Inc., Dallas, Tex., or the Model MM3A from Kleindiek Nanotechnik, Reutlingen, Germany, can precisely move objects within the vacuum chamber. Micromanipulator 247 may comprise precision electric motors 248 positioned outside the vacuum chamber to provide X, Y, Z, and theta control of a portion 249 positioned within the vacuum chamber. The micromanipulator 247 can be fitted with different end effectors for manipulating small objects. In the embodiments described herein, the end effector is a thin probe 650.

A gas delivery system 146 extends into lower chamber 126 for introducing and directing a gaseous vapor toward substrate 122. U.S. Pat. No. 5,851,413 to Casella et al. for "Gas Delivery Systems for Particle Beam Processing," assigned to the assignee of the present invention, describes a suitable gas delivery system 146. Another gas delivery system is described in U.S. Pat. No. 5,435,850 to Rasmussen for a "Gas Injection System," also assigned to the assignee of the present invention. For example, iodine can be delivered to enhance etching, or a metal organic compound can be delivered to deposit a metal.

System controller 119 controls the operations of the various parts of dual beam system 110. Through system controller 119, a user can cause ion beam 118 or electron beam 143 to be scanned in a desired manner through commands entered into a conventional user interface (not shown). Alternatively, system controller 119 may control dual beam system 110 in accordance with programmed instructions stored in a memory 121. In some embodiments, dual beam system 110 incorporates image recognition software, such as software commercially available from Cognex Corporation, Natick, Mass., to automatically identify regions of interest, and then the system can manually or automatically extract samples in accordance with the invention. For example, the system could automatically locate similar features on semiconductor wafers including multiple devices, and take samples of those features on different (or the same) devices.

Figure 2:
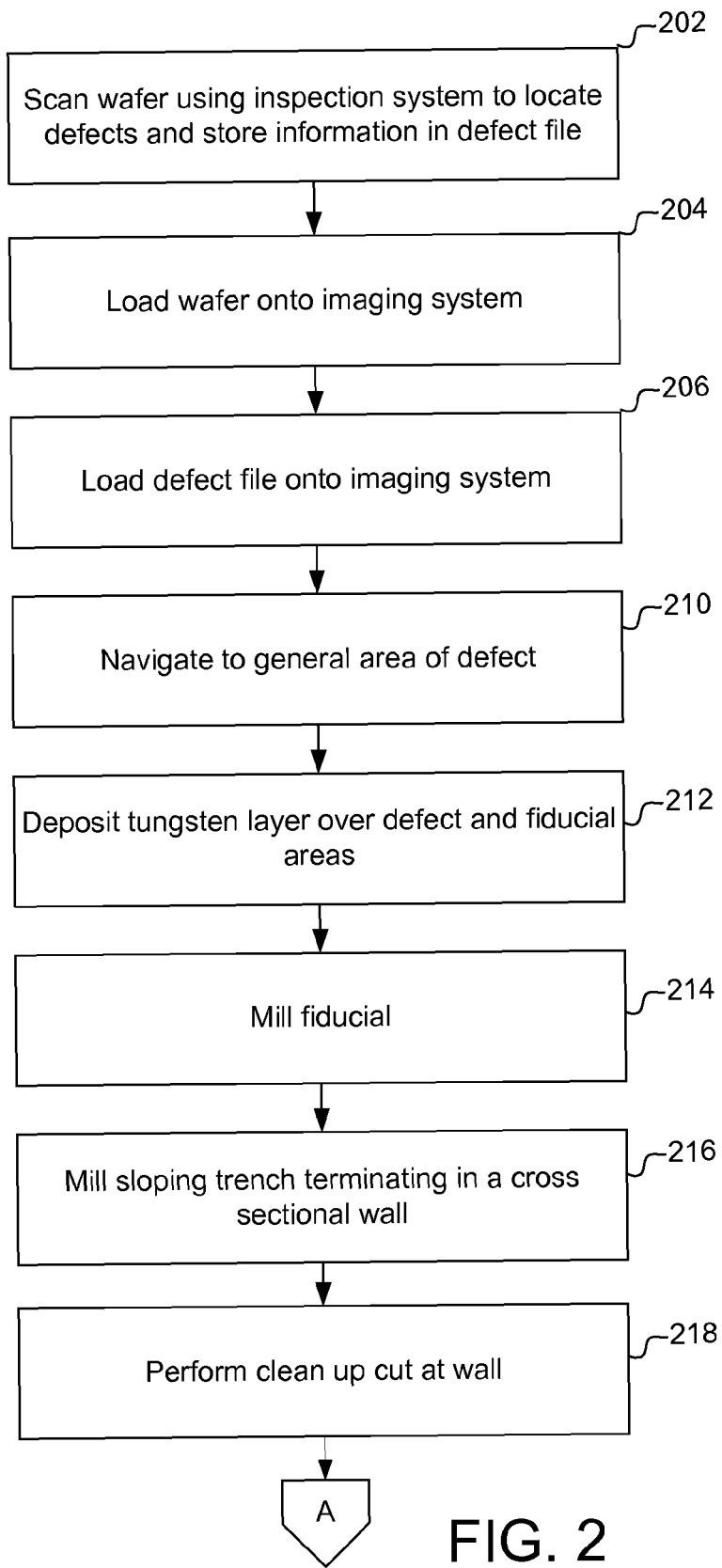
FIG. 2 is a flow chart showing steps of a preferred embodiment of the present invention.
Figure 3:
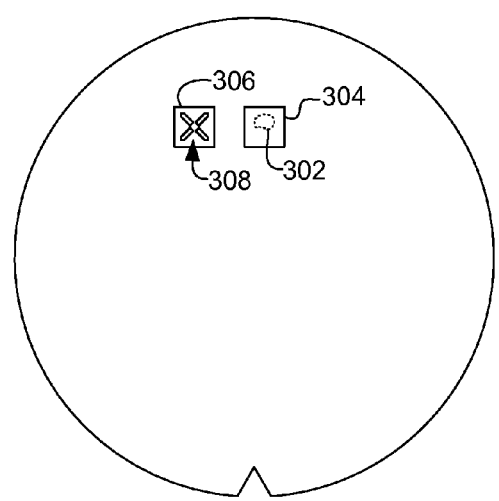
FIG. 3 shows a wafer during processing in accordance with an embodiment of the invention.
Figure 4:
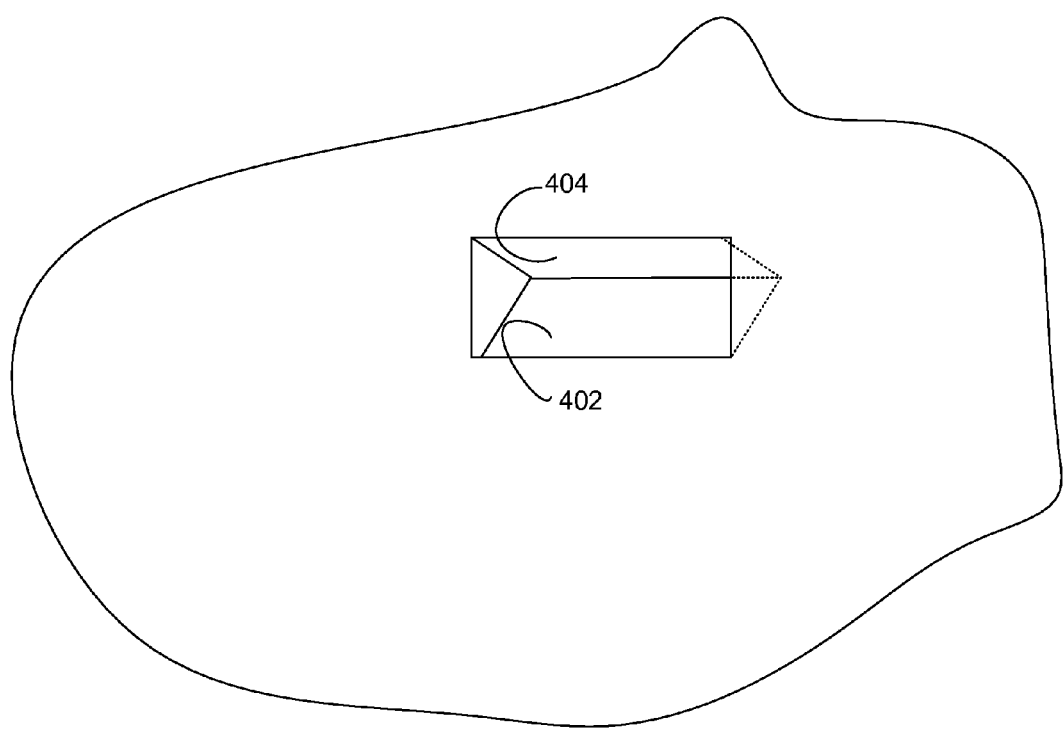
FIG. 4 shows an enlarged portion of the wafer of FIG. 3 in which a trench has been milled in front of the defect location.

FIG. 2 is a flow chart showing several steps of a method in accordance with the invention. FIGS. 3 and 4 show a wafer undergoing some of the steps shown in FIG. 2. In step 202, a wafer is scanned using an inspection tool, such as a KLA-Tencor 2800 Series Inspection System and a defect file, such as a KLARF file, is generated that lists anomalies detected on the surface. The defect file includes the coordinates of defects located by the inspection tool. The wafer may be scanned during different stages of fabrication, so that the defect detected in one scan may be covered by a subsequently applied layer before the wafer is transferred from the inspection system to an imaging system.

In step 204, the wafer is loaded into an imaging system 110, such as the DA-300 Defect Analyzer from FEI Company. The stage in the imaging system is typically tilted to 52 degrees from the horizontal so that the ion beam impacts normal to the wafer surface, and the electron beam impacts the wafer surface at 52 degrees. In some embodiments, a cross sectional wall that is nearer to a right angle with the wafer surface is achieved by having the ion beam impact the surface at a slight angle from the normal because of the Gaussian shape of the beam cross section. A stage tilt angle of 53 or 54 degrees provides a more vertical cross-section wall than a stage tilt of 52 degrees. In step 206, data from the defect file is transferred from the inspection system to the dual beam system. In step 210, the imaging system navigates so that the general area of a defect 302 (FIG. 3) is located within the field of view. The defect 302 may be below the surface, as show by the dashed lines in FIG. 3, and not visible in the electron beam image. In some cases, the defect 302 may be on the surface and visible or a manifestation of the defect may be visible at the surface.

In step 212, a tungsten layer is deposited on the substrate surface using ion-beam-induced deposition to provide a protective pad 304 in the area above defect 302 and a protective pad 306 in a region near defect 302. In step 214, a fiducial 308 is milled in pad 306 to facilitate accurate positioning of the beam. The fiducial 308 is preferably of a robust shape so that the centerline of the fiducial is readily recognizable even after repeated scans by the ion beam, which tends to erode the fiducial. The fiducial is preferably milled sufficiently close to the location of the cross section so that the stage does not need to be moved to shift the beam position from the fiducial to the area being milled. That is, the beam can be shifted sufficiently using beam deflection electrodes to image the fiducial or to mill the cross section without requiring a stage movement. The beam position is obtained by re-imaging the fiducial to obtain new coordinate offsets to adjust the system for beam and stage drift. The coordinates of the fiducial are known, so any discrepancy between the known fiducial coordinates and the measured fiducial coordinates produce an offset that can be applied to the measured coordinates. In machines that have no edge recognition capability, local beam placement is performed solely using the fiducial as a reference.

After the fiducial 308 is milled, a sloping trench 402 (FIG. 4) is milled in step 216 approximately 1 µm from the estimated defect location. The trench typically has a width of about 4 microns and is preferably about 1.0 µm to 1.5 µm in depth. The depth of the trench may depend on the estimated position of the defect below the surface. The angle of the trench is sufficient so that both the ion beam and the electron beam can scan a cross section 404 at the end of the trench 402. Cross section 404 is normal to the substrate surface. In step 218, a thin, finishing cut is made at the wall 404 to provide a smoother surface than was provided by the beam when it was removing a relatively large quantity of material to mill trench 402.

Figure 5:
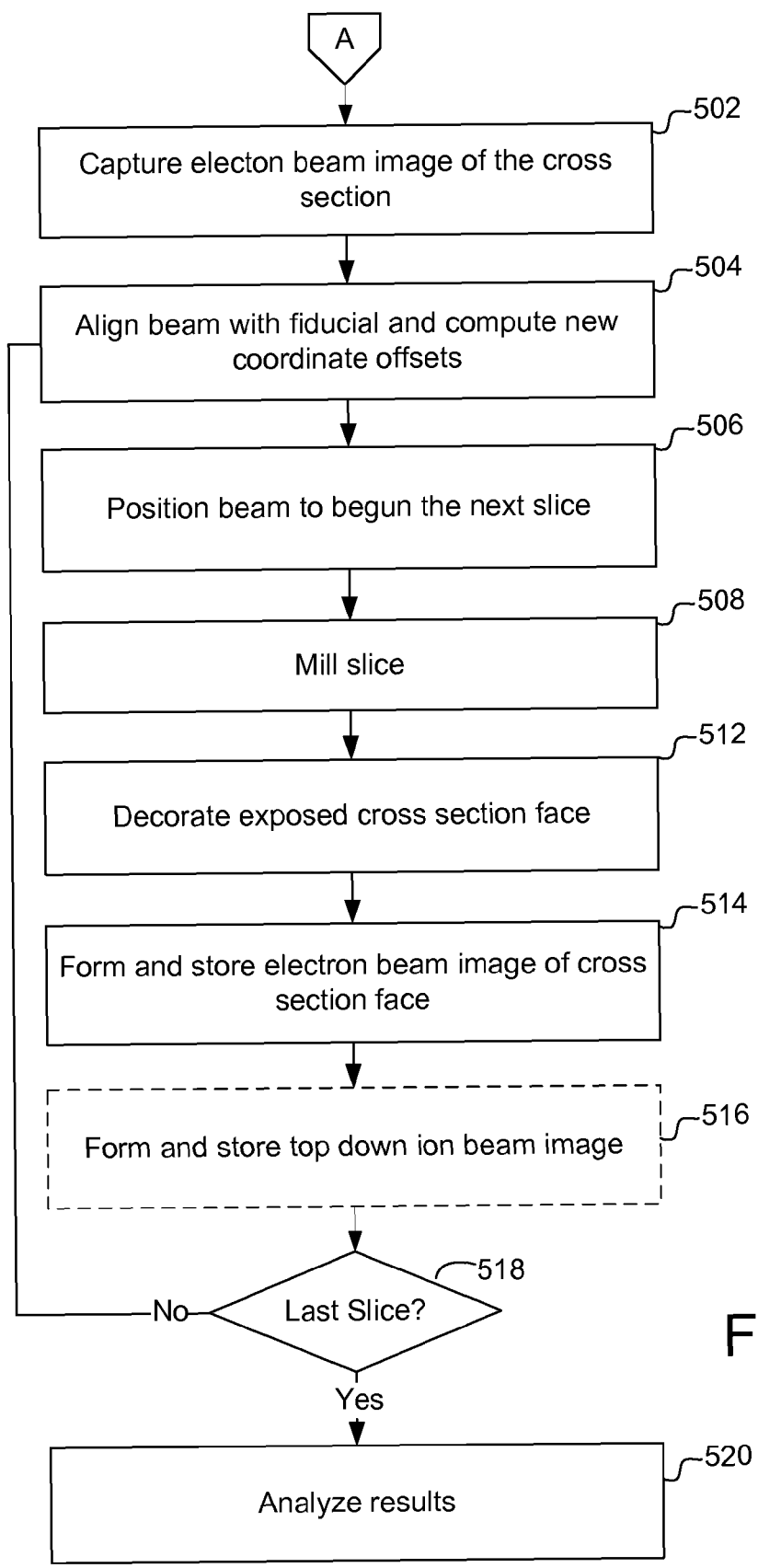
FIG. 5 is a flow chart showing additional steps of a preferred embodiment of the present invention.

The preferred process continues as shown in FIG. 5. In step 502, an image of the exposed cross section 404 is formed using the electron beam and stored. The electron beam is typically operated at 5 kV and uses a through-the-lens detector. In step 504, the ion beam is directed to the fiducial and an ion beam image is taken to recalibrate the position of the beam. An electron beam image of the fiducial is also captured to align the electron beam. After recalibrating, the ion beam is then moved in step 506 so that the beam is positioned for milling a slice from the cross-section face 404. The beam is positioned a fixed distance in from the existing cross section wall. As described above, the fiducial and area to be milled are preferably within the same field of view, so that the stage does not need to be moved between milling slices, thereby removing a source of positioning error.

Figure 6:
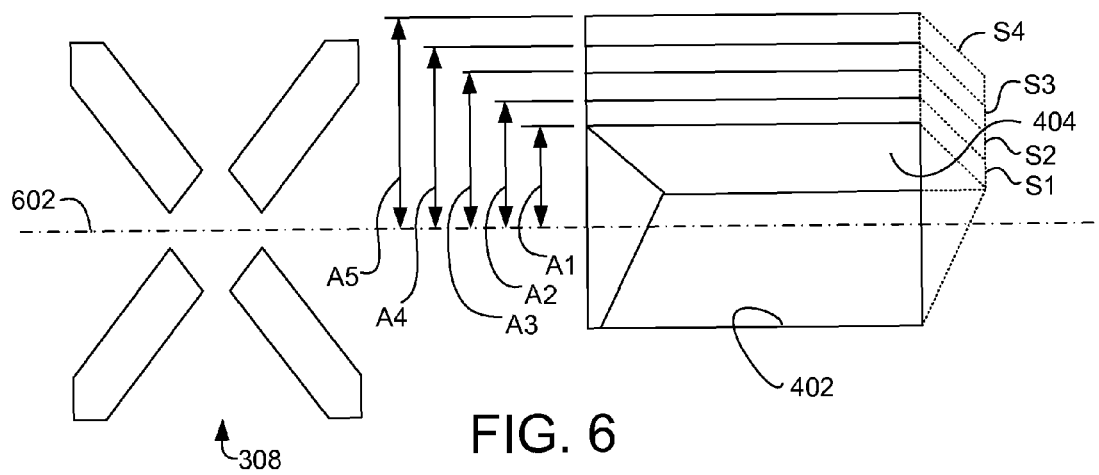
FIG. 6 shows schematically the series of slices milled in the wafer shown in FIG. 2.

FIG. 6 shows that the ion beam is aligned at a fixed distance A1 from a center line 602 of the fiducial 308. The distance A1 from the wall 404 to the center line 602 is known from the previous milling operation. In step 508, the ion beam starts milling and advances into the wall an amount, A2–A1, equal to the desired thickness of a slice S1. The slice S1 should be sufficiently thin so that the probability of obtaining a cross section of the thin defect is great. The thinner the slice, the greater the probability of viewing the defect. If the slice is too thin, however, the image quality is adversely affected by redeposition of the tungsten protective layer.

In step 512, the exposed cross section wall 404 is decorated, that is, lightly preferentially etched to show a contrast between layers of similar materials. The electron beam is directed toward the cross section face while an etch-enhancing gas, such as xenon difluoride, is directed toward the exposed wall of the cross section. The electron beam and gas preferentially etches some of the materials present on the exposed cross section face, so that the interface between materials stands out in subsequent imaging. For example, xenon difluoride etches silicon oxides faster than it etches silicon nitrides and so leaves a small stair-step edge at the oxide-nitride boundary. Typically less than about 30 nm of material, and more preferably less than 20 nm of material, are removed to make the interface visible. In step 514, the electron beam is directed toward the decorated face to form an electron beam image, which is stored. The electron beam is typically oriented at 52 degrees to the exposed cross section surface. In optional step 516, a top-down image is the ion beam is used to more accurately determine the actual slice thickness. If there is another slice to be milled, decision block 518 indicates that the process returns to step 504 to perform another stage alignment before milling the next slice. The process steps 506-516 are repeated. FIG. 6 shows the ion beam advancing to distances A2 to A5 from centerline 602 to cut slices S2 to S4. While four slices are shown for illustration, a user will more typically mill and decorate more slices, for example, fifteen slices.

In a preferred embodiment that cuts fifteen slices, the setting of the beam position is advanced 60 nm for each of slices one through five. Slices after the first five are milled by advancing the setting of the beam position 50 nm for each slice. This change in the amount of beam repositioning appears to provide uniform slice thicknesses between all slices. While the setting of the beam position advances 50 nm to 60 nm, applicants measured the slice thickness after each slice using a top down ion beam image and found an average slice thickness of 38.2 nm. Applicants believe that the difference between the measured slice thickness and the distance that the beam advances between slices is likely due to a calibration offset between the beam setting and the actual beam position, as well as edge effects, related to the fact that the beam is milling on the edge of precipice, rather than in an open area. The cut has some tendency to come up "shallow." Slice thicknesses of 38.2 nm provided a high probability of imaging defects while providing a good image and with very little redeposition. Applicants note that the beam diameter is significantly larger than the thickness of each slice, with the beam diameter being as large as one micron, while the slices are preferably less than 100 nm, more preferably less than 50 nm, and most preferably less than about 40 nm. By "slice thickness" is meant the amount of material removed by the combination of the electron beam-assisted decoration step and the ion beam step, as controlled by the movement of the position of the ion beam.

Figure 7:
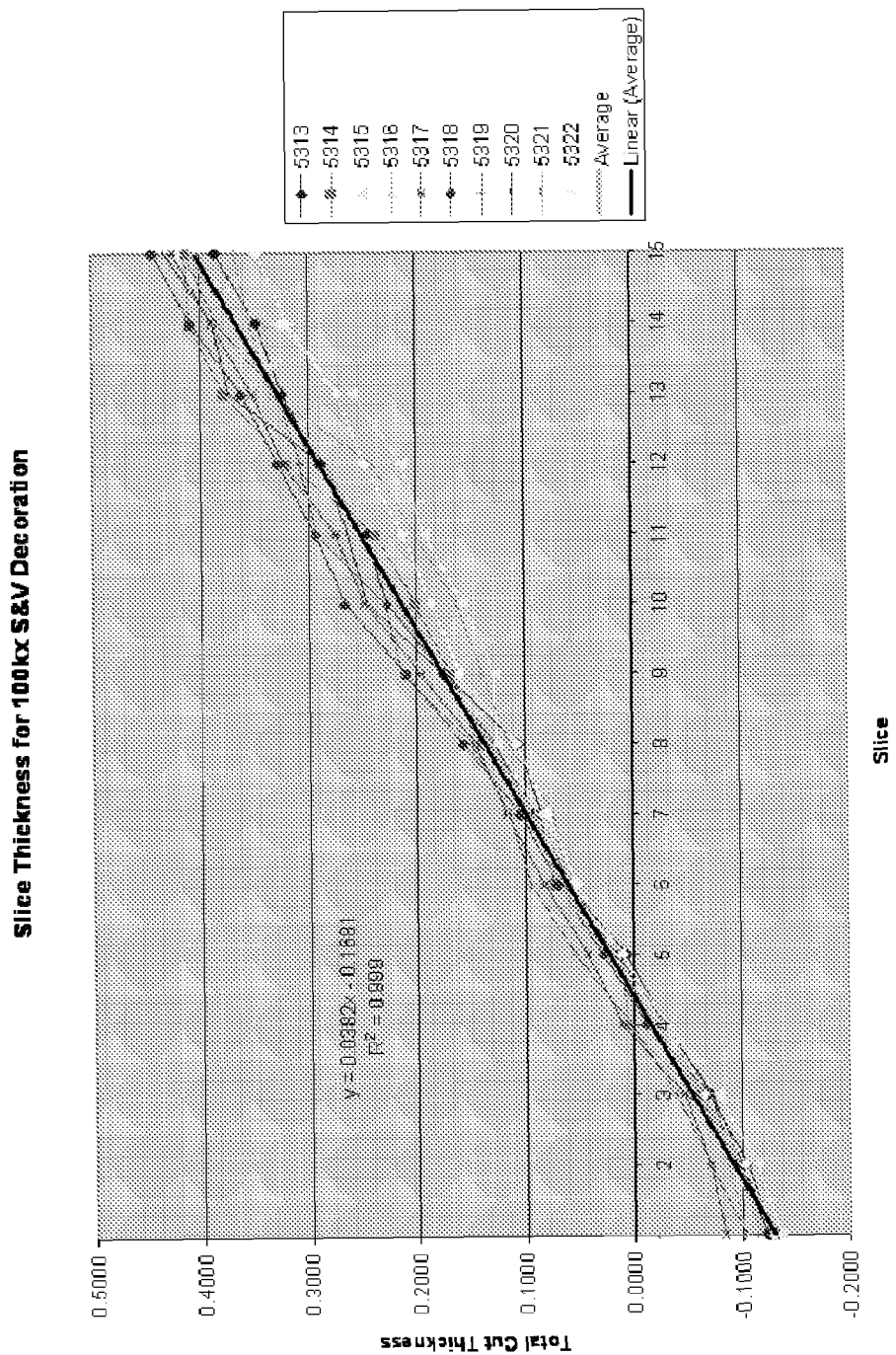
FIG. 7 is a graph showing the thicknesses of slices milled in accordance with an embodiment of the invention.
Figure 8:
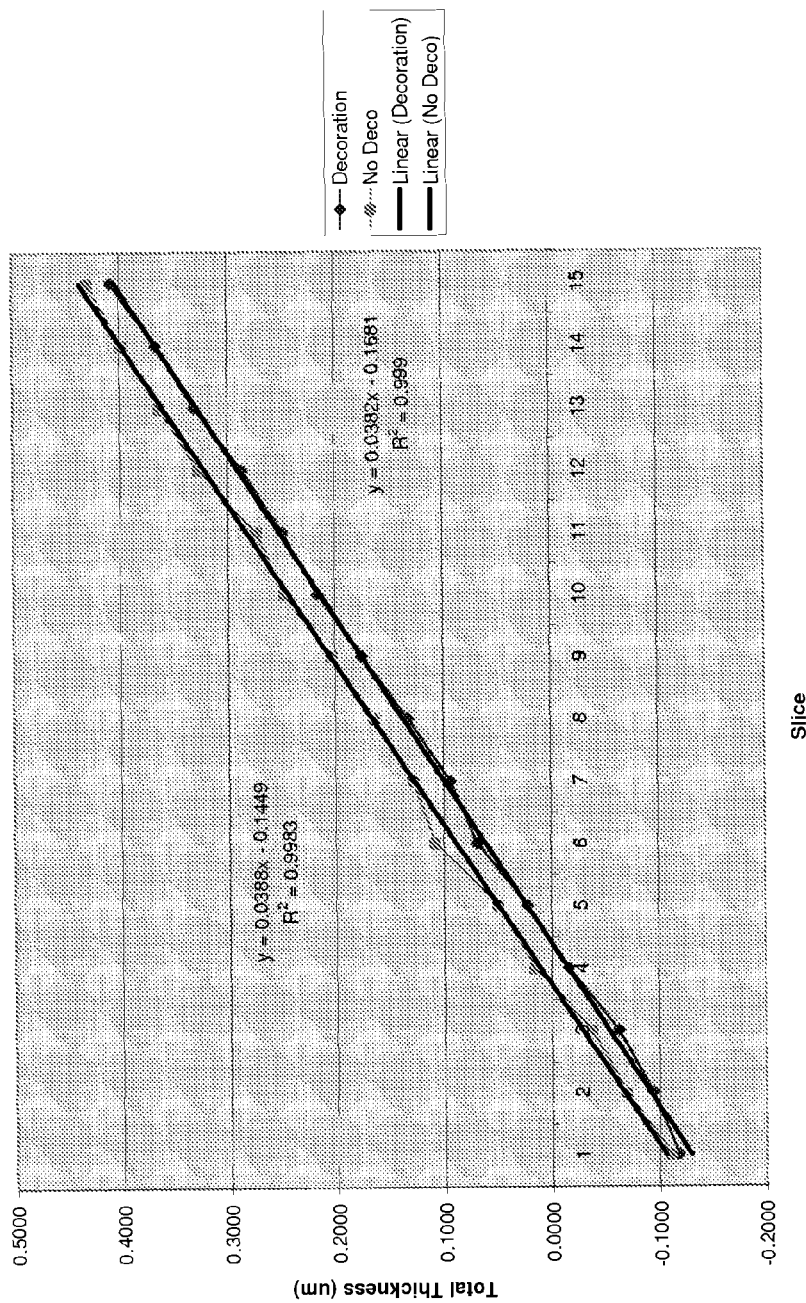
FIG. 8 shows average slice thicknesses with and without decoration.
Figure 9:
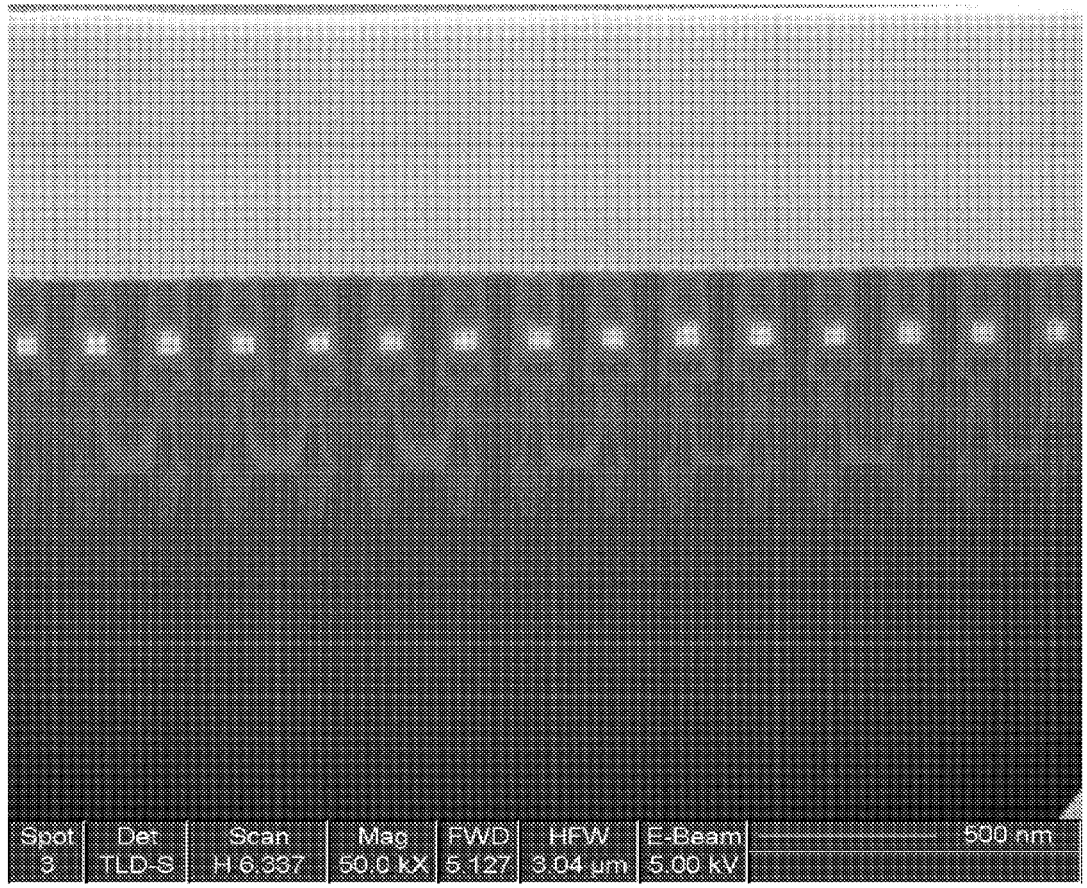
FIG. 9 shows a cross section without decoration.
Figure 10:
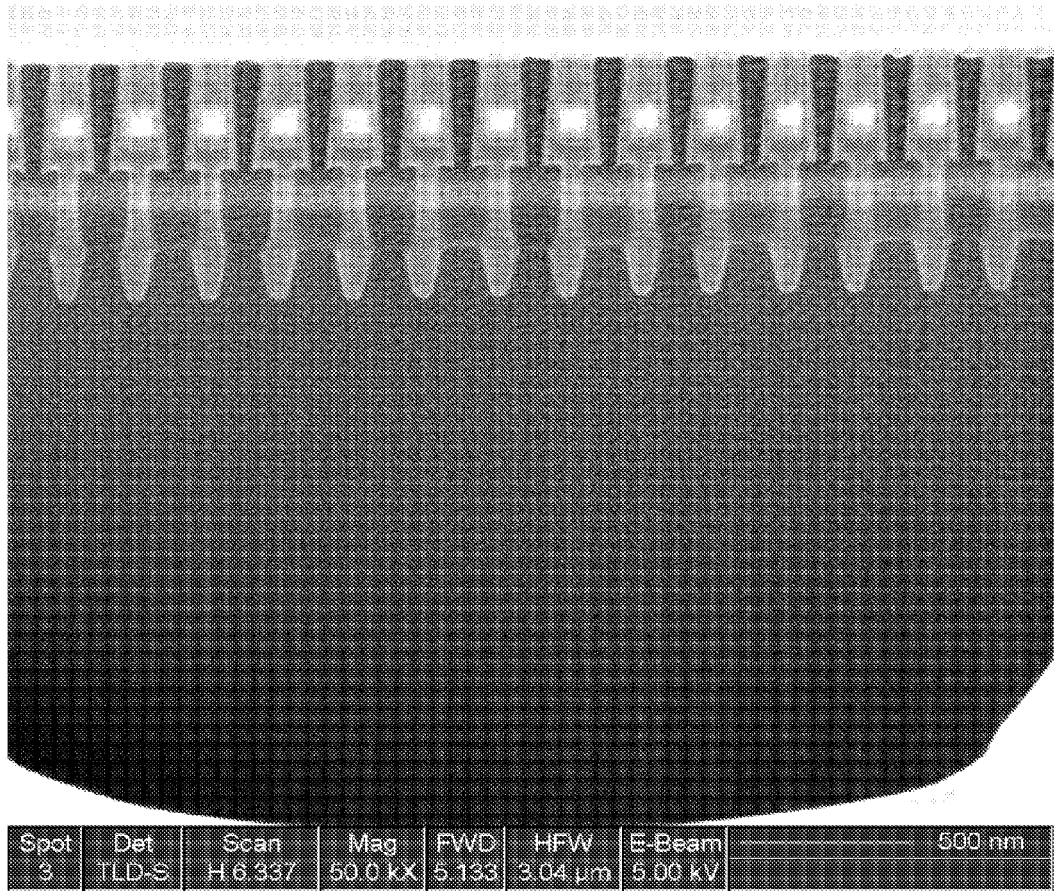
FIG. 10 shows a cross section similar to that of FIG. 9, but with decoration to increase contrast.

FIG. 7 shows a graph of measured slice thicknesses at ten positions on a wafer, with fifteen slices at each position. The thickness was measured using a top down image from the ion beam with each slice having been decorated to improve contrast. FIG. 8 shows average slice thicknesses with and without decoration. FIG. 8 shows that the decorated slices were essentially the same thickness as the undecorated slices. FIG. 9 is an electron beam photomicrograph of a cross section at 50,000 magnification without decoration. FIG. 10 shows a similar an electron beam photomicrograph with decoration, which greatly improves the contrast.

Figure 11:
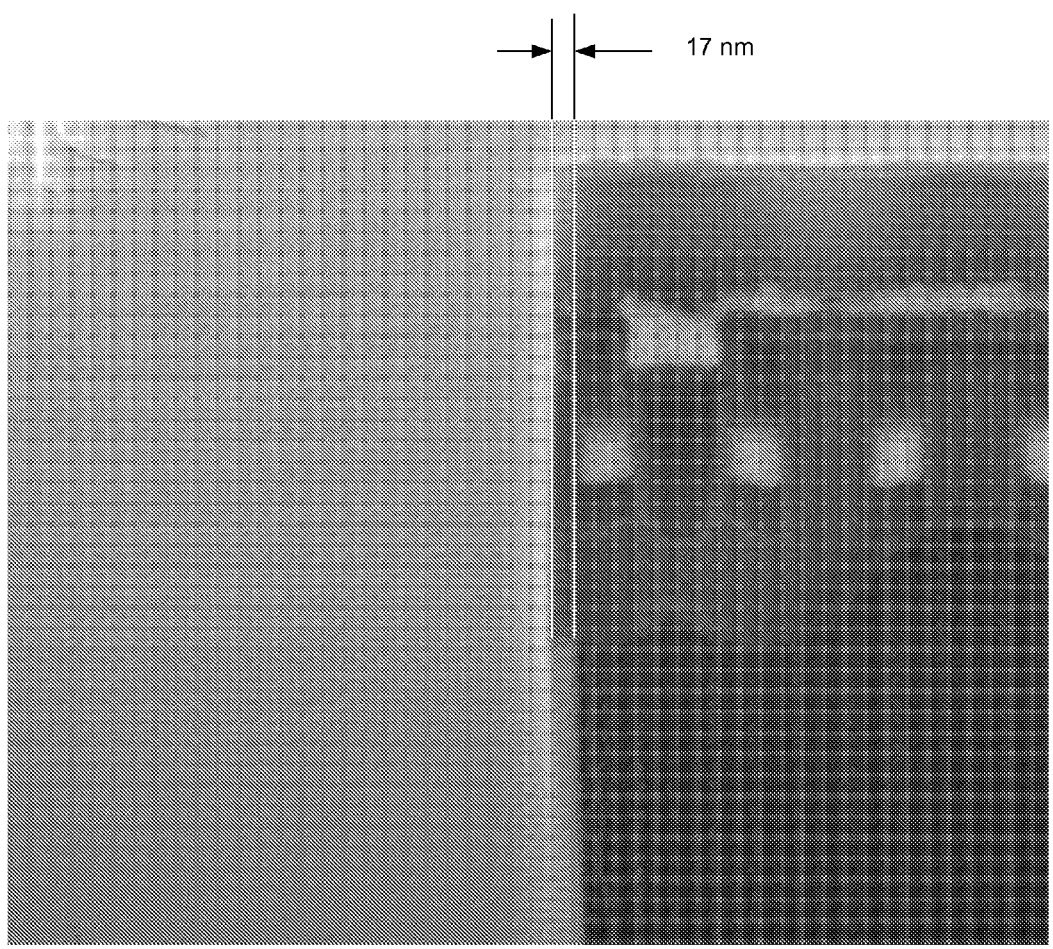
FIG. 11 is a cross section of a cross section, showing the extent of etching in a decoration step.

To determine damage from the decoration step, applicants rotated a wafer and cut a cross section normal to the cross section that was made to view the defect. FIG. 11 shows such a cross-sectional view of a cross section wall, that is, the FIG. 11 shows a cross section cut perpendicular to the wall 404. FIG. 11 shows that the etching caused by the decoration step is a most about 17 nm.

Figure 12:
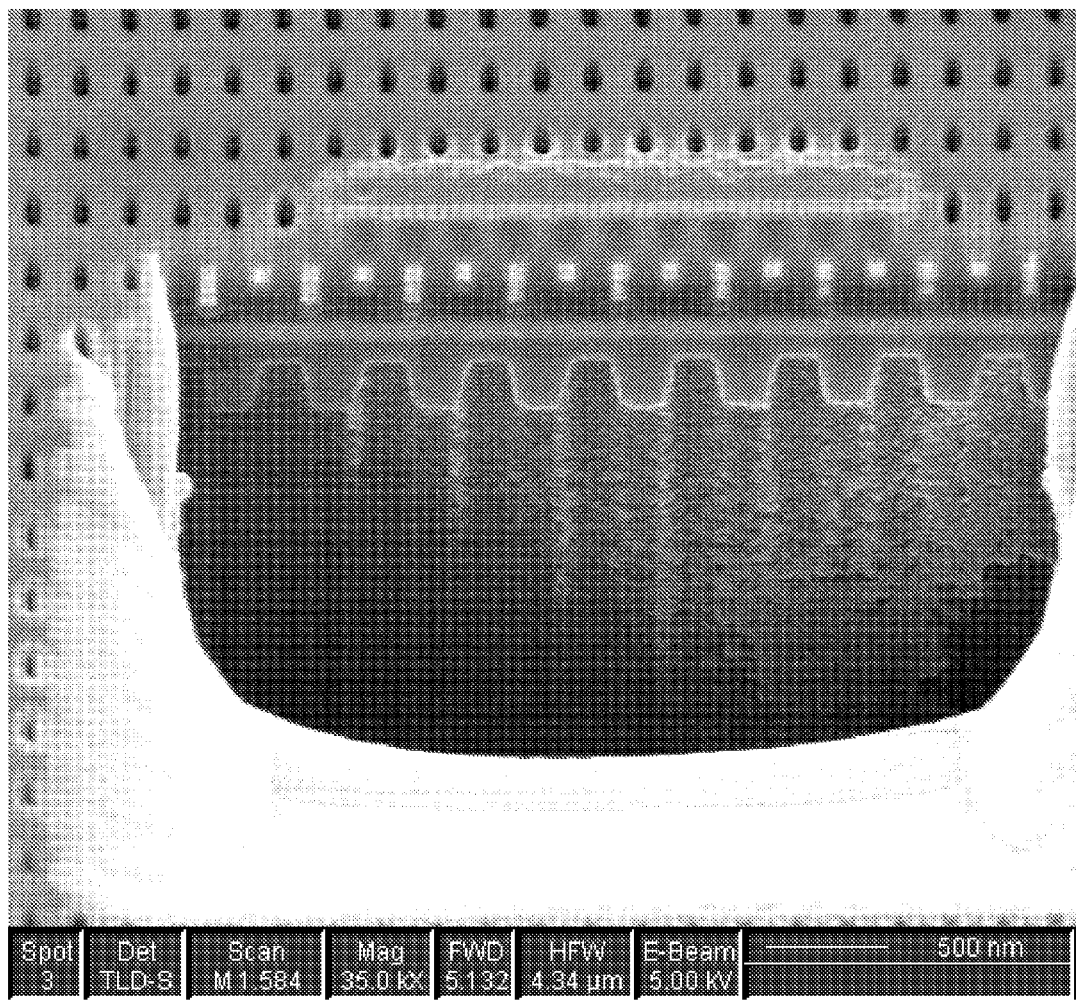
FIG. 12 shows redeposition of tungsten affecting the image quality.

FIG. 12 is a rotated view of a cross section after a very thin slice was milled. FIG. 12 shows that the electron beam image is affected by the redeposition of tungsten from the protective layer when slice thickness was reduced to less than 30 nm. The bright areas on the cross section are redeposited tungsten. The redeposition obscured the actual surface that is to be investigated and the redeposition is therefore undesirable. Applicants have found that using a slightly thicker slice mitigates the redeposition problem.

The slice thickness should be well controlled. If the slices are too thick, it is possible that the defect will not be cross sectioned, and it is therefore desirable to produce slices as thin as possible to detect defects as small as possible. If the slices are too thin, however, the tungsten from the protective layer redeposits on the cross section face altering the surface and obscuring features. The beam placement should therefore be very precise. Because there is drift in the stage placement and in the beam positioning, the system typically requires either frequent coordinate transformation adjustments by imaging a fiducial or use of image recognition to locate the existing edge so that the slice can be made relative to the existing edge. Frequent imaging of the fiducial tends to erode it, making it more difficult to accurately identify the centerline of the fiducial and align to it. While in a very stable system, a user may not need to realign the stage between each slice, such realignment improves the placement accuracy of the beam for milling the next slice.

Although embodiments of the present invention and its advantages have been described in detail, it should be understood that various changes, substitutions and alterations can be made herein without departing from the spirit and scope of the invention as defined by the appended claims. For example, while the examples provided show the use of the invention in connection with semiconductor wafers used in the fabrication of integrated circuits, the invention can be use in any nano or micro manufacturing process, with any type of substrate that Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A method for observing a buried defect on a substrate using a charged particle beam, comprising:
    (a) directing an ion beam toward a substrate to mill a trench in the substrate, the trench exposing a vertical wall including at least a first material and a second material, the interface between the first material and the second material not being initially visible in an electron beam image of the exposed vertical wall;
    (b) directing an electron beam toward the vertical wall in the presence of an etchant to etch material from the vertical wall, the first material being etched at a greater rate than the second material, the difference in the etch rates between the first material and the second material being sufficient to make visible in an electron beam image the interface between the first material and the second material;
    (c) directing an electron beam toward the vertical wall to form an electron beam image of the vertical wall, the image showing the interface between the first and second materials;
    (d) directing an ion beam toward the substrate to remove material from the vertical wall to expose a subsequent vertical wall including at least the first material and the second material, the interface between the first material and the second material not being initially visible in an electron beam image of the newly exposed vertical wall, the distance between the vertical wall and the subsequent vertical wall being between 30 nm and 60 nm of material; and
    (e) repeating steps (b) through (d) such that the vertical wall advances to expose a buried feature for imaging.

2. The method of claim 1 in which directing an electron beam toward the vertical wall in the presence of an etchant to etch material from the vertical wall includes removing less than 30 nm from the vertical wall.

3. The method of claim 2 in which directing an electron beam toward the vertical wall in the presence of an etchant to etch material from the vertical wall includes removing less than 20 nm from the vertical wall.

4. The method of claim 1 further comprising directing an ion beam toward the substrate to mill a fiducial (308), the fiducial being sufficiently close to the trench such that the ion beam can be moved between the fiducial and the trench without moving the substrate.

5. The method of claim 4 in which repeating steps (b) through (d) includes directing the ion beam to image the fiducial at least once to calibrate the positioning of the ion beam.

6. The method of claim 5 in which directing the ion to image the fiducial at least once to calibrate the positioning of the ion beam includes directing the ion beam to image the fiducial before each repetition of step (d) to calibrate the positioning of the ion beam.

7. The method of claim 4 in which directing the ion beam toward the substrate to mill a fiducial includes directing the ion beam approximately normal to the surface and in which directing an electron beam toward the vertical wall in the presence of an etchant includes directing the electron beam at a non-normal angle relative to the vertical wall.

8. The method of claim 7 further comprising forming an image of the substrate using the ion beam.

9. The method of claim 1 in which directing an electron beam toward the vertical wall in the presence of an etchant includes directing an electron beam toward the vertical wall in the presence of xenon difluoride.

10. The method of claim 1 in which the step of directing an electron beam toward the vertical wall in the presence of an etchant includes etching less than 20 nm from the vertical wall and in which the step of directing an ion beam toward the substrate to remove between 30 and 60 nm of material from the vertical wall together remove less than 50 nm from the vertical wall.

11. The method of claim 10 in which the step of directing an electron beam toward the vertical wall in the presence of an etchant and the step of directing an ion beam toward the substrate to remove between 30 and 60 nm of material from the vertical wall together remove less than 40 nm from the vertical wall.

12. The method of claim 1 in which directing an ion beam toward a substrate to mill a trench in the substrate includes obtaining the coordinates of a defect from a defect file from a wafer inspection system and milling a trench in the vicinity of the point specified defect coordinates.

13. The method of claim 12 in which at least one repetition of step (d) includes exposing a portion of the defect.

14. The method of claim 1 in which directing an ion beam toward the substrate to remove between 30 nm and 60 nm of material from the vertical wall includes directing an ion beam having a beam diameter greater than thickness of the material removed.

15. The method of claim 1 further comprising depositing a protective coat onto the substrate surface before performing steps (a)-(d).

16. An apparatus for observing a defect using a charged particle beam, including:
    an ion beam column for generating, focusing, and directing an ion beam;
    an electron beam column for generating, focusing, and directing an electron beam;
    a controller for controlling the operation of the electron beam and the ion beam, the controller including a memory including stored computer instructions for;
    (a) directing an ion beam toward a substrate to mill a trench in the substrate, the trench exposing a vertical wall including at least a first material and a second material, the interface between the first material and the second material not being initially visible in an electron beam image of the exposed vertical wall;
    (b) directing an electron beam toward the vertical wall in the presence of an etchant to etch material from the vertical wall, the first material being etched at a greater rate than the second material, the difference in the etch rates between the first material and the second material being sufficient to make visible in an electron beam image the interface between the first material and the second material;
    (c) directing an electron beam toward the vertical wall to form an electron beam image of the vertical wall, the image showing the interface between the first and second materials;
    (d) directing an ion beam toward the substrate to remove material from the vertical wall to expose a subsequent vertical wall including at least the first material and the second material, the interface between the first material and the second material not being initially visible in an electron beam image of the newly exposed vertical wall, the distance between the vertical wall and the subsequent vertical wall being between 30 nm and 60 nm of material; and
    (e) repeating steps (b) through (d) such that the vertical wall advances to expose a buried feature for imaging.

17. The apparatus of claim 16 in which the computer instructions for directing an electron beam toward the vertical wall in the presence of an etchant includes computer instructions for removing less than 30 nm from the vertical wall.

18. The apparatus of claim 16 in which the memory including stored computer instructions further includes computer instructions for directing an ion beam toward the substrate to mill a fiducial sufficiently close to the trench such that the ion beam can be moved between the fiducial and the trench without moving the substrate.

19. The apparatus of claim 16 in which the computer instructions for directing an electron beam toward the vertical wall in the presence of an etchant and the computer instructions for directing an ion beam toward the substrate to remove between 30 and 60 nm of material together comprise computer instructions for removing less than 50 nm from the vertical wall.

20. The apparatus of claim 16 in which computer instructions for directing an ion beam toward a substrate to mill a trench in the substrate includes computer instructions for obtaining the coordinates of a defect from a defect file from a wafer inspection system and milling a trench in the vicinity of the point specified defect coordinates.

* * * * *